(12) United States Patent
Oyamada (10) Patent No.: US 7,285,451 B2
(45) Date of Patent: Oct. 23, 2007

(54) SEMICONDUCTOR INTEGRATED CIRCUIT DEVICE MANUFACTURING METHOD

(75) Inventor: Makoto Oyamada, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/402,862

(22) Filed: Apr. 13, 2006

(65) Prior Publication Data

US 2006/0232300 A1 Oct. 19, 2006

(30) Foreign Application Priority Data

Apr. 15, 2005 (JP) ............... 2005-118522

(51) Int. Cl.
*H01L 21/336* (2006.01)
*H01L 21/26* (2006.01)
*G01R 31/66* (2006.01)

(52) U.S. Cl. ............ 438/197; 438/199; 438/14; 257/369; 257/E21.177

(58) Field of Classification Search ....... 438/197, 438/199, 14; 430/311; 257/369; 326/121; 327/210, 391
See application file for complete search history.

(56) References Cited

U.S. PATENT DOCUMENTS

| | | | | |
|---|---|---|---|---|
| 6,064,097 A | * | 5/2000 | Hiraga | .............. 257/369 |
| 6,090,510 A | * | 7/2000 | Tokuda | .............. 430/30 |
| 6,475,862 B1 | * | 11/2002 | Ando | .............. 438/264 |
| 6,912,697 B2 | * | 6/2005 | Shibata et al. | .............. 716/1 |
| 2005/0001270 A1 | * | 1/2005 | Esmark et al. | .............. 257/355 |

FOREIGN PATENT DOCUMENTS

| | | |
|---|---|---|
| JP | 2001-156261 A | 6/2001 |
| JP | 2004-165649 A | 6/2004 |
| JP | 2004-228417 A | 8/2004 |

\* cited by examiner

*Primary Examiner*—Michael Lebentritt
*Assistant Examiner*—Mohsen Ahmadi
(74) *Attorney, Agent, or Firm*—Sughrue Mion Pllc.

(57) ABSTRACT

To reduce variation in channel lengths of MOS transistors within a circuit functional module. When exposure of a wafer substrate having a semiconductor integrated circuit device 1 including a plurality of CMOS circuit module regions CCM11 to CCM22 to be subject to substrate bias control formed in a core region 10 is performed using a step-and-scan type projection exposure apparatus, scanning is performed in the same direction as a longitudinal direction of the respective CMOS circuit module regions CCM11 to CCM22. In this device, a gate insulating film is formed on the substrate, a gate electrode material film is formed on the gate insulating film, and a photoresist film is formed on the gate electrode material film.

4 Claims, 8 Drawing Sheets

PRIOR ART

SEMICONDUCTOR INTEGRATED CIRCUIT DEVICE MANUFACTURING METHOD

FIELD OF THE INVENTION

The present invention relates to a semiconductor integrated circuit device manufacturing method. More specifically, the invention relates to the manufacturing method of a semiconductor integrated circuit device in which a core region is divided into a plurality of CMOS circuit module regions, and a substrate bias of each CMOS circuit module region is controlled.

BACKGROUND OF THE INVENTION

In recent years, with finer geometries of MOS transistors and increased chip area in the semiconductor integrated circuit device, delay variation caused by variation in characteristics of the MOS transistors within a chip has increased, and this becomes a factor in tightening a timing constraint condition. In order to reduce this delay variation, a technology has been developed in which the core region of the semiconductor integrated circuit device is divided into a plurality of CMOS circuit module regions, and substrate biases of the MOS transistors are controlled for each of the CMOS circuit module regions, thereby reducing variations in the characteristics of the MOS transistors among the CMOS circuit module regions and among chips.

When variation in channel lengths of the MOS transistors within each of the CMOS circuit modules is great, a problem may arise that the variation in the characteristics within the CMOS circuit module region caused by dependency of a substrate bias effect on a channel length increases. For this reason, a technology for reducing the variation in the channel lengths of the MOS transistors within each of the CMOS circuit modules is desired.

Figure 6:
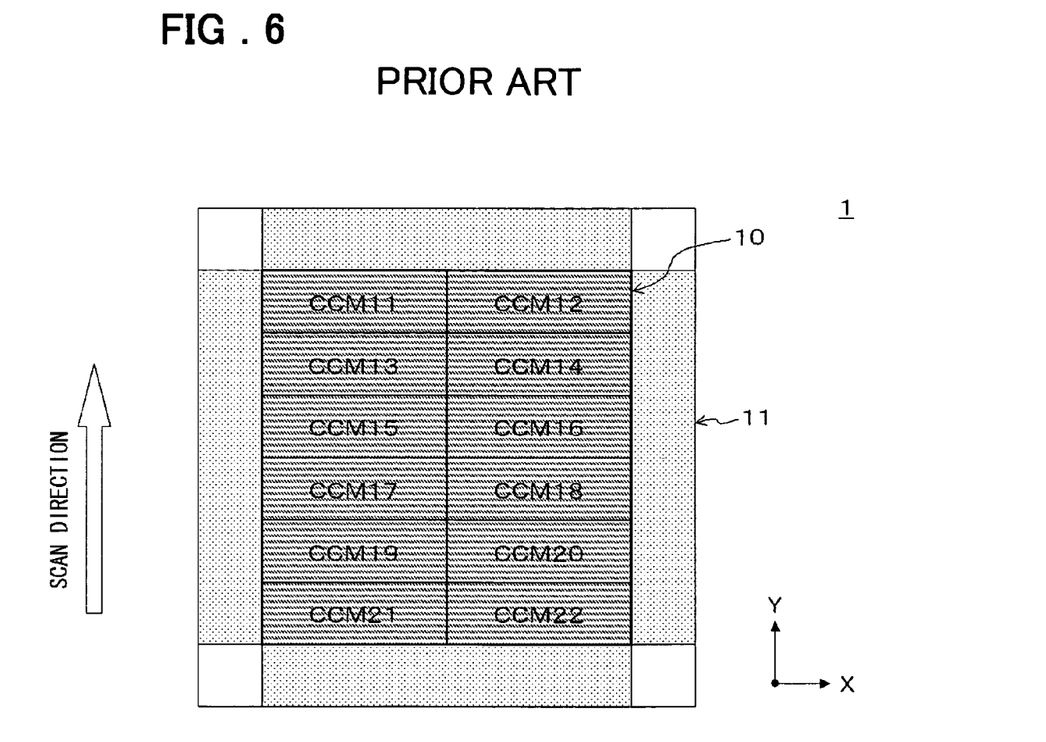
FIG. 6 is a plan view schematically showing an example of a configuration of a conventional semiconductor integrated circuit device.
Figure 7:
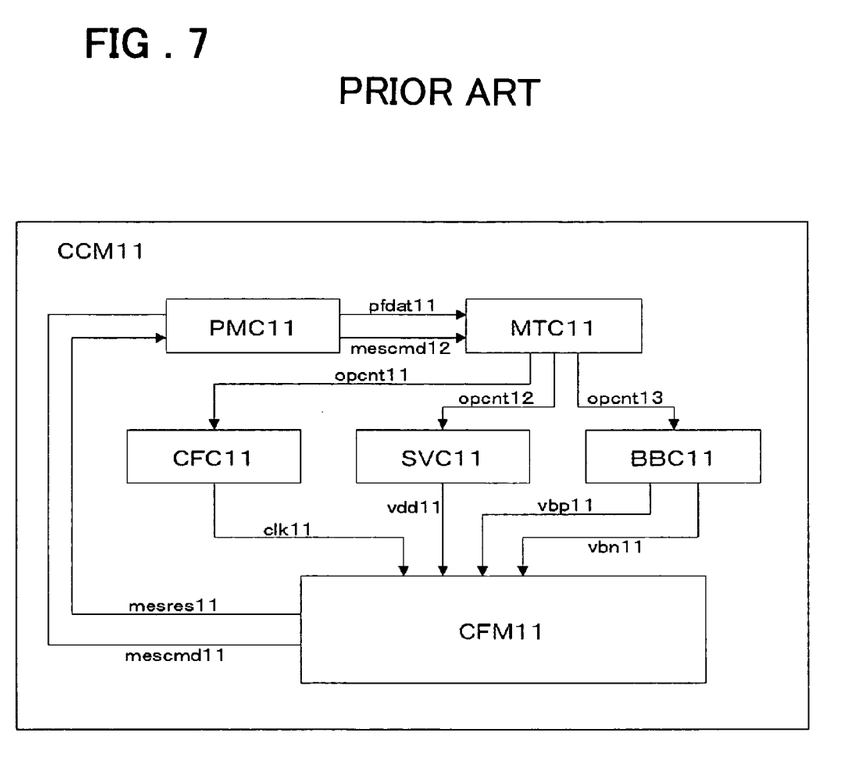
FIG. 7 is a block diagram schematically showing an example of a configuration of a CMOS circuit module region in the conventional semiconductor integrated circuit device.

Now, using drawings, a description will be directed to a conventional semiconductor integrated circuit device in which the core region is divided into the CMOS circuit module regions and the substrate biases of the MOS transistors in each of the CMOS circuit module regions is controlled. FIG. 6 is a plan view schematically showing an example of a configuration of the conventional semiconductor integrated circuit device. FIG. 7 is a block diagram schematically showing an example of a configuration of the CMOS circuit module region in the conventional semiconductor integrated circuit device.

A semiconductor integrated circuit device 1 includes a core region 10, and an input/output region 11 (refer to FIG. 6). The core region 10 is the region including a plurality of CMOS circuit module regions CCM11 to CCM22. The input/output region 11 is the region for inputting or outputting data.

Each of the CMOS circuit module regions CCM11 to CCM22 constitutes a rectangular shape with an X axis direction used as a longitudinal direction thereof and with a Y axis direction used as a short side direction thereof, as seen from the direction of a normal to a plane (or the direction perpendicular to the drawing; a Z axis direction). Referring to FIG. 6, the CMOS circuit module regions CCM11 to CCM22 are aligned in six columns and two rows in the core region 10. In each of the CMOS circuit module regions CCM11 to CCM22, an N well or a P well (not shown) is formed within the region, and the CMOS circuit module regions CCM11 to CCM22 are electrically separated by field oxide films (not shown) at boundaries thereof. The longitudinal direction (X axis direction) of each of the CMOS circuit module regions CCM11 to CCM22 is orthogonal to a scan direction (direction of scanning by a step-and-scan type projection exposure apparatus: Y axis direction).

In the CMOS circuit module region CCM11, a circuit functional module CFM11, a performance measurement circuit PMC11, a storage (memory) table circuit MTC11, a clock frequency control circuit CFC11, a supply voltage control circuit SVC11, and a substrate bias control circuit BBC11 are formed (refer to FIG. 7). Formation of the CMOS circuit module regions CCM12 to CCM22 is also performed in the same way as the CMOS circuit module region CCM11.

To the circuit functional module CFM11, a clock signal clk11, a supply voltage vdd11, a PMOS transistor substrate bias vbp11, an NMOS transistor substrate bias vbn11, and a measurement command signal mescmd11 are input. The circuit functional module CFM11 outputs a measurement result signal mesres11. The performance measurement circuit PMC11 outputs the measurement command signal mescmd11 and a measurement command signal mescmd12. A measurement result signal mesres11 is input to the performance measurement circuit PMC11, and the performance measurement circuit PMC11 outputs a result associated with the measurement result signal mesres11 as a performance data signal pfdat11. The measurement command signal mescmd12 and the performance data signal pfdat11 are input to the storage table circuit MTC11. The storage table circuit MTC11 outputs operation control signals opcnt11, opcnt12, and opcnt13. The clock frequency control circuit CFC11 inputs the operation control signal opcnt11 and outputs the clock signal clk11. To the supply voltage control circuit SVC11, the operation control signal opcnt12 is input. The supply voltage control circuit SVC11 outputs the supply voltage vdd11. The operation control signal opcnt13 is input to the substrate bias control circuit BBC11. The substrate bias control circuit BBC11 outputs the PMOS transistor substrate bias vbp11 and the NMOS transistor substrate bias vbn11.

Performance such as a data processing speed (or an operation speed) or power consumption of the circuit functional module CFM11 changes according to a frequency of the clock signal clk11, a voltage of the supply voltage vdd11, and voltages of the substrate biases vbp11 and vbn11 supplied to the circuit functional module CFM11. In order to maximize a ratio of the operation speed of the circuit functional module CFM11 to the power consumption of the circuit functional module CFM11 and to implement optimal control over the clock signal clk11, supply voltage vdd11, and substrate biases vbp11 and vbn11, performance measurement is performed on all combinations of the frequency of the clock signal clk11, voltage of the supply voltage vdd11, and voltages of the substrate biases vbp11 and vbn11 that can be generated by the clock frequency control circuit CFC11, supply voltage control circuit SVC11, and substrate bias control circuit BBC11, respectively, and an optimal condition is then determined.

Conventionally, when gate poly mask exposure (exposure of a mask pattern for gate formation onto a wafer substrate) using the step-and-scan type projection exposure apparatus was performed in a manufacturing process of the semiconductor integrated circuit device described above, no particular consideration was given to the scan direction therefor. Scanning was performed in the Y-axis direction in FIG. 6, for example.

[Patent Document 1]
  Japanese Patent Kokai Publication No. JP-P2001-156261A
[Patent Document 2]
  Japanese Patent Kokai Publication No. JP-P2004-165649A
[Patent Document 3]
  Japanese Patent Kokai Publication No. JP-P2004-228417A

SUMMARY OF THE DISCLOSURE

However, when the substrate biases of the circuit functional modules CFM11 to CFM22 are controlled, variation may occur in the substrate bias effect on the MOS transistors due to the variation in the channel lengths of the MOS transistors within the circuit functional modules CFM11 to CFM22. Then, the variation in the characteristics of the MOS transistors may increase, so that circuit performances (operation speeds) of the circuit functional modules CFM11 to CFM22 may deteriorate. The reason for this is that the substrate bias effect on the MOS transistors has the channel length dependency.

The larger the variation in the channel lengths of the MOS transistors within the circuit functional modules CFM11 to CFM22 becomes, more manifest deterioration of the circuit performances becomes. For this reason, when designing the circuit functional modules CFM11 to CFM22, a timing margin corresponding to an increment of the variation needs to be considered.

It is a primary object of the present invention to reduce variation in channel lengths of MOS transistors in a circuit functional module.

Figure 4:
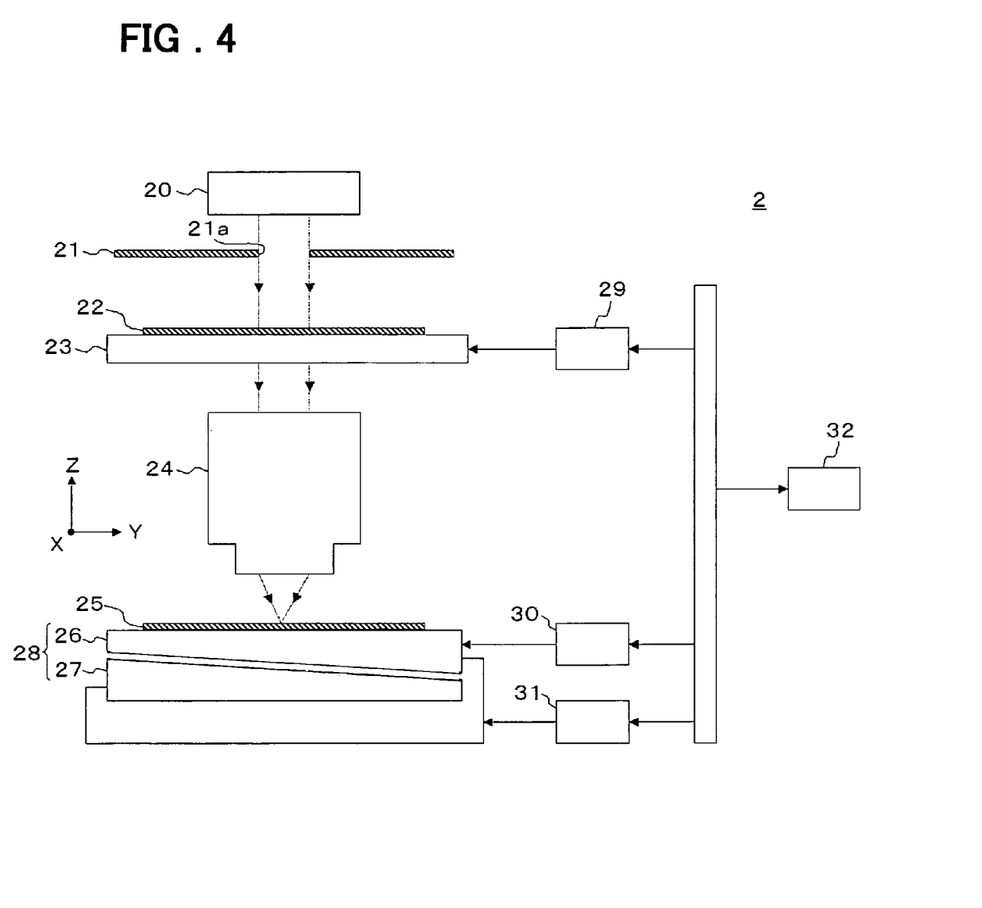
FIG. 4 is a schematic diagram showing a configuration of a step-and-scan type projection exposure apparatus.
Figure 5:
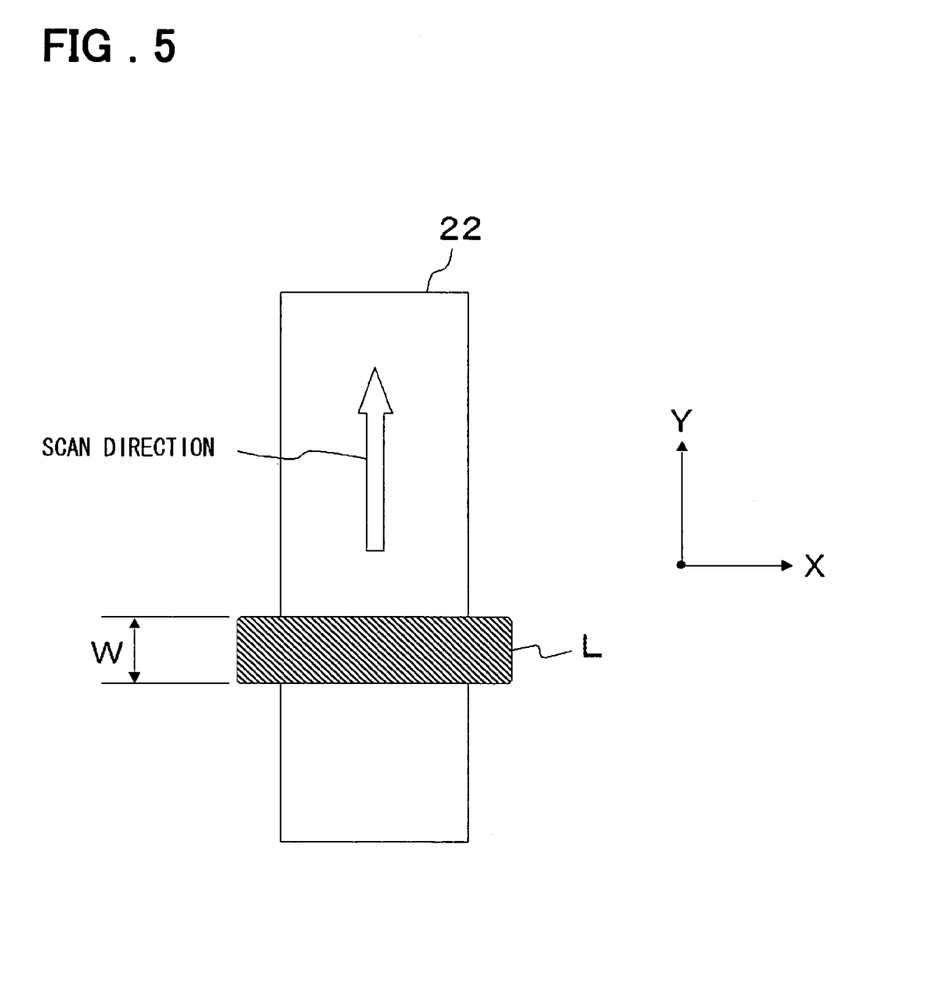
FIG. 5 is a schematic diagram showing a scanning method using illumination light from the step-and-scan type projection exposure apparatus.
Figure 8A:
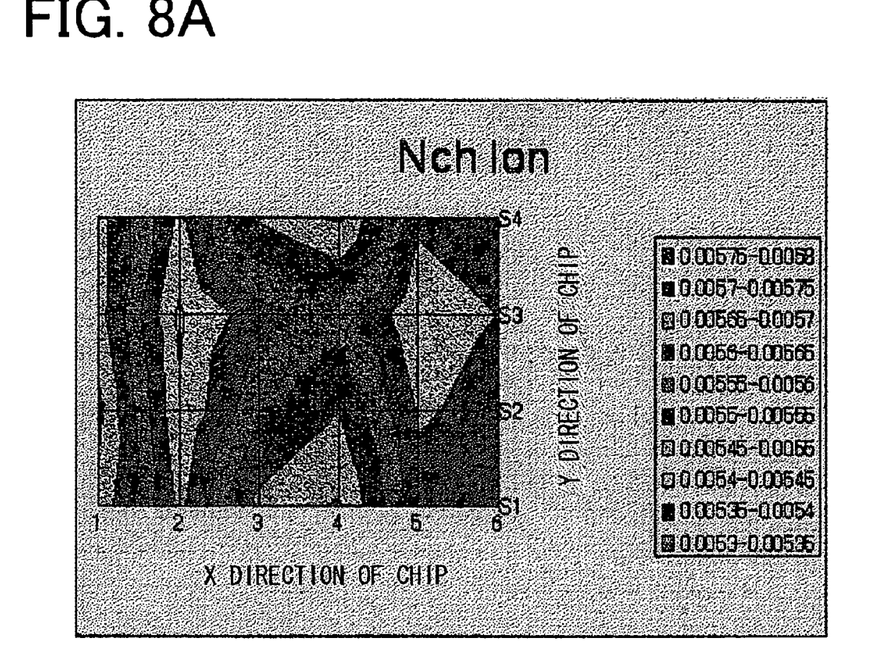
FIG. 8A is a contour line diagram, analyzed by the present invention, showing examples of Ion characteristics of N-channel MOS transistors in the semiconductor integrated circuit device exposed by the step-and-scan type projection exposure apparatus.
Figure 8B:
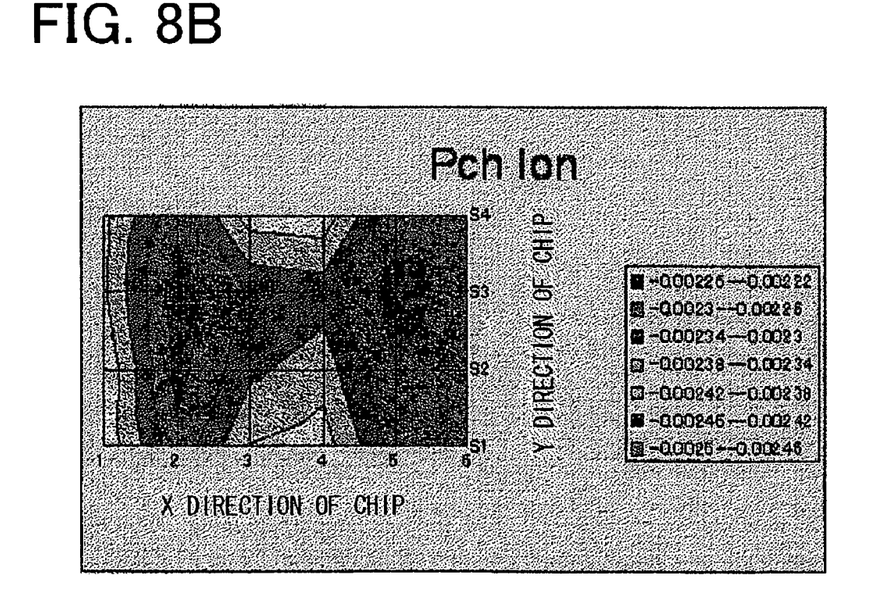
FIG. 8B is a contour line diagram, analyzed by the present invention, showing examples of Ion characteristics of P-channel MOS transistors in the semiconductor integrated circuit device exposed by the step-and-scan type projection exposure apparatus.

In solving the problems described above, the inventor has found that a magnitude of variation in the channel lengths of MOS transistors in circuit functional modules CFM11 (refer to FIG. 7) to CFM22 in a conventional semiconductor integrated circuit device depends on the shape of each of the circuit functional modules CFM11 to CFM22 and the scan direction when gate poly mask exposure (exposure of a mask pattern for gate formation onto a substrate) by a step-and-scan type projection exposure apparatus is performed. A correlation thereof will be described below with reference to drawings. FIG. 4 is a schematic diagram showing a configuration of the step-and-scan type projection exposure apparatus. FIG. 5 is a schematic diagram showing a scanning method using illumination light from the step-and-scan type projection exposure apparatus. FIGS. 8A and 8B include contour diagrams showing examples of Ion characteristics of the MOS transistors in the semiconductor integrated circuit device exposed by the step-and-scan type projection exposure apparatus. FIG. 8A relates to N channel MOS transistors, while FIG. 8B relates to P channel MOS transistors.

A step-and-scan type projection exposure apparatus 2 is the apparatus for projecting a portion of the mask pattern onto the substrate of a wafer by a projection optical system, and synchronizingly positioning and moving the mask and the wafer with respect to a projection exposure system relatively, thereby exposing the overall mask pattern. The step-and-scan type projection exposure apparatus 2 has a mechanism for causing a wafer stage to perform a stepping motion, thereby allowing repeated exposure of the mask pattern onto the substrate (refer to FIG. 4). The step-and-scan type projection exposure apparatus 2 converts i rays from a mercury lamp (not shown) to parallel rays at an illumination optical system 20, for output, causes these rays to pass through a photomask 22 on a photomask stage 23 through a slit 21, and performs reduced projection of the pattern of the photomask 22 onto a wafer substrate 25 on a wafer stage 28 through a projection optical system 24. As shown in FIG. 6, in the core region 10 of the semiconductor integrated circuit device 1 on the wafer substrate 25, the CMOS circuit module regions CCM11 to CCM22 that are subject to substrate bias control are formed. Then, a gate insulating film (not shown) is formed on the substrate, a gate electrode material film (not shown) is formed on the gate insulating film, and a photoresist film (not shown) is formed on the gate electrode material film.

While the illumination optical system 20, slit 21, and projection optical system 24 are fixed on the step-and-scan type projection exposure apparatus 2, the photomask stage 23 and the wafer stage 28 are movable in synchronization with the Y axis direction, which is the scan direction, in FIG. 4.

The photomask 22 is the photomask for gate formation, and opens so that the longitudinal direction of a gate pattern is parallel with the X axis direction. While an opening portion 21a of the slit 21 opens in the X axis direction (direction perpendicular to the surface of paper) with a width a little larger than the size of the photomask 22 in the X axis direction, the opening portion 21a opens in the Y axis direction with a width w (refer to FIG. 5) narrower than the size of the photomask 22 in the Y axis direction (refer to FIG. 4). For this reason, when the photomask stage 23 is driven to cause the photomask 22 to move to a plus (+) direction of the Y axis in FIG. 4, illumination light L with the width w, which has passed through the slit 21 (refer to FIG. 5), scans over the photomask 22 in a minus (−) direction of the Y axis in FIG. 4.

The wafer stage 28 is constituted from an XY stage 27 for moving the wafer substrate 25 within an XY surface and a Z stage 26 for moving the wafer substrate 25 in a Z axis direction, thereby allowing three-dimensional movement of the wafer substrate 25 to a specified position by a combination of operations of both of the stages 26 and 27 (refer to FIG. 4).

The illumination light L with the width w that has passed through the slit 21 passes through the photomask 22 and the projection optical system 24, and is then exposed onto the wafer substrate 25. The width w, however, is usually smaller than the size of the photomask 22 in the X axis direction. Thus, an image exposed onto the wafer substrate 25 tends to be more subject to an influence of lens aberration of the projection optical system 24 in the direction (X axis direction) perpendicular to scanning than in the scan direction (Y axis direction). Due to the influence of the lens aberration, a component of the variation in the channel lengths of the MOS transistors in the direction (X axis direction) perpendicular to the scan direction becomes larger than a component of the variation in the channel lengths of the MOS transistors in the direction (Y axis direction) parallel to the scan direction.

Referring to FIGS. 8A and 8B, it can be confirmed that, because components of the variations in the channel lengths of both of the N-channel MOS transistors in FIG. 8A and the P-channel MOS transistors in FIG. 8B in the direction (X axis direction) perpendicular to the scan direction become larger than components of the variations in the channel lengths of the N-channel and P-channel MOS transistors in the direction (Y axis direction) parallel to the scan direction, components of variations in the Ion characteristics of the N-channel and P-channel MOS transistors in the direction (X axis direction) perpendicular to the scan direction have also become larger than components of variations in the Ion characteristics of the N-channel and P-channel MOS transistors in the direction (Y axis direction) parallel to the scan direction.

Accordingly, the following problems would result. Namely, because of the fact that the respective CMOS circuit module regions CCM11 to CCM22 are horizontally long in the X axis direction in the conventional semiconductor integrated circuit device 1 shown in FIG. 6, the gate pattern associated with the circuit functional modules CFM11 (refer to FIG. 7) to CFM22, which are constituents of the conventional semiconductor integrated circuit device 1, also become horizontally long in the X axis direction. On contrast therewith, when scanning in the Y axis direction shown in FIG. 6 is performed at a time of the gate poly mask exposure (exposure of the mask pattern for gate formation onto the substrate), the variation in the channel lengths of the MOS transistors in the circuit functional modules CFM11 to CFM22 becomes larger than the case where the respective circuit functional modules CFM11 to CFM 22 are formed to be perpendicularly long in the Y axis direction. Circuit performances (operation speeds) may thereby deteriorate. Solutions to the problem described above will be shown below.

In a semiconductor integrated circuit device manufacturing method according to a first aspect of the present invention, when a wafer substrate including a semiconductor integrated circuit device having a plurality of CMOS circuit module regions formed in a core region thereof is exposed using a step-and-scan type projection exposure apparatus, the scanning is performed in the same direction as the longitudinal direction of each of the CMOS circuit module regions in the core region, the CMOS circuit module regions being subject to substrate bias control, the semiconductor integrated circuit device being configured to include a gate insulating film formed on the substrate, a gate electrode material film formed on the gate insulating film, and a photoresist film formed on the gate electrode material film.

Namely, there is provided a method for manufacturing a semiconductor integrated circuit device comprising the steps of:

(a) providing a wafer substrate including a semiconductor integrated circuit device having a plurality of CMOS circuit module regions formed in a core region thereof, said CMOS circuit module regions being subject to substrate bias control, said semiconductor integrated circuit device being configured to include a gate insulating film formed on said substrate, a gate electrode material film formed on said gate insulating film, and a photoresist film formed on said gate electrode material film; and (b) exposing said water substrate using a step-and-scan type projection exposure apparatus; wherein upon said exposing, scanning is performed in a same direction as a longitudinal direction of each of said CMOS circuit module regions in said core region.

In the semiconductor integrated circuit device manufacturing method of the invention, it is preferable that a gate pattern associated with circuit functional modules of the CMOS circuit module regions in the core region is formed in a photomask used at a time of the exposure by the step-and-scan type projection exposure apparatus, and that the longitudinal direction of the gate pattern is arranged in the same direction as the scan direction of the step-and-scan type projection exposure apparatus.

In a semiconductor integrated circuit device manufacturing method according to a second aspect of the present invention, when a wafer substrate including a semiconductor integrated circuit device having a plurality of CMOS circuit module regions formed in an input/output region thereof is exposed using a step-and-scan type projection exposure apparatus, the scanning is performed in the same direction as the direction of boundaries between the CMOS circuit module regions being adjacent to one another in the input/output region, the CMOS circuit module regions being subject to substrate bias control, the semiconductor integrated circuit device being configured to include a gate insulating film formed on the substrate, a gate electrode material film formed on the gate insulating film, and a photoresist film formed on the gate electrode material film.

In other words, there is provided a method for manufacturing a semiconductor integrated circuit device comprising the steps of:

(a) providing a wafer substrate including a semiconductor integrated circuit device having a plurality of CMOS circuit module regions formed in an input/output region thereof, said CMOS circuit module regions being subject to substrate bias control, said semiconductor integrated circuit device being configured to include a gate insulating film formed on said substrate, a gate electrode material film formed on said gate insulating film, and a photoresist film formed on said gate electrode material film; and (b) exposing said water substrate using a step-and-scan type projection exposure apparatus, wherein upon said exposing, scanning is performed in a same direction as a direction of boundaries between said CMOS circuit module regions being adjacent to one another in said. input/output region.

In the semiconductor integrated circuit device manufacturing method of the present invention, it is preferable that a gate pattern associated with circuit functional modules of the CMOS circuit module regions in the input/output region is formed in a photomask used at a time of the exposure by the step-and-scan type projection exposure apparatus, and that the longitudinal direction of the gate pattern is arranged in the same direction as the scan direction of the step-and-scan type projection exposure apparatus.

The meritorious effects of the present invention are summarized as follows.

According to the present invention (as set forth in the first and second aspects), the component of variation in the channel lengths of the MOS transistors in the direction parallel to the scan direction becomes smaller than the component of the variation in the channel length of the MOS transistors in the direction perpendicular to the scan direction. Thus, variation in the characteristics of the MOS transistors within the circuit functional modules is reduced. The circuit performances (operation speeds) of the circuit functional modules are thereby improved.

PREFERRED EMBODIMENTS OF THE INVENTION

FIRST EMBODIMENT

Figure 1:
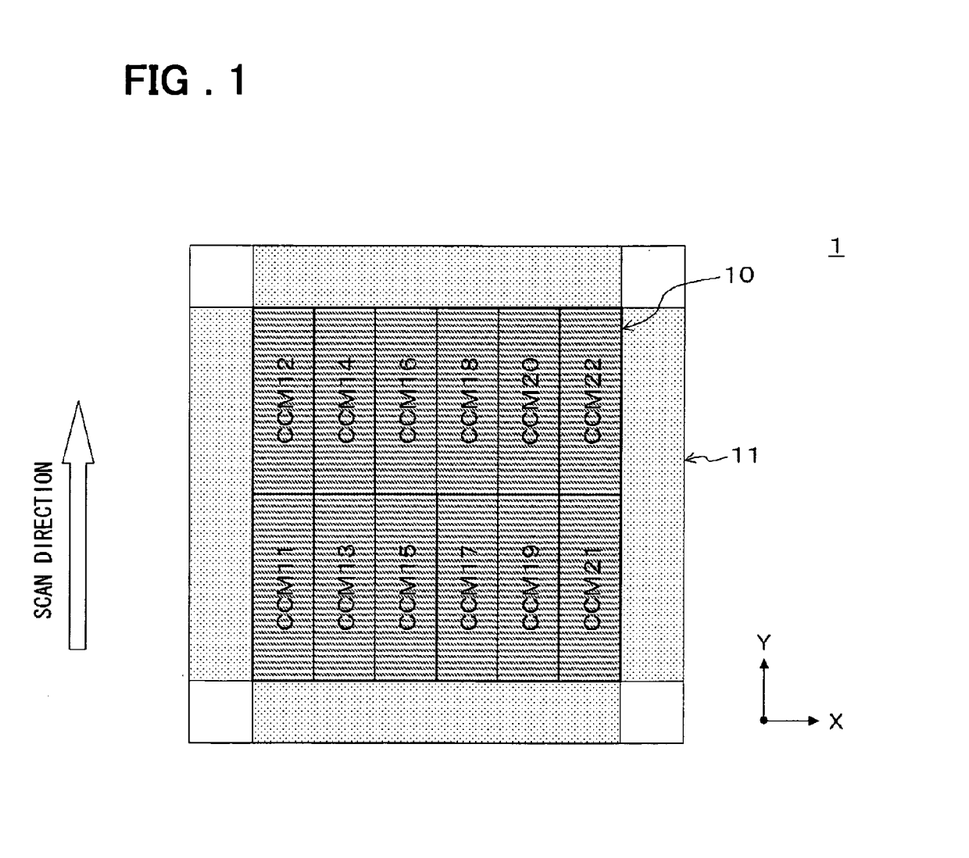
FIG. 1 is a plan view schematically showing a configuration of a semiconductor integrated circuit device manufactured by a semiconductor integrated circuit device manufacturing method according to a first embodiment of the present invention.

A semiconductor integrated circuit device manufacturing method according to a first embodiment of the present invention will be described using drawings. FIG. 1 is a plan view schematically showing a configuration of a semiconductor integrated circuit device manufactured by the semiconductor integrated circuit device manufacturing method according to the first embodiment of the present invention.

A semiconductor integrated circuit device 1 manufactured by the semiconductor integrated circuit device manufacturing method according to the first embodiment has a core region 10 and an input/output region 11 (refer to FIG. 1). The core region 10 is the region that has a plurality of CMOS circuit module regions CCM11 to CCM22. The input/output region 11 is the region for inputting or outputting data.

Each of the CMOS circuit module regions CCM11 to CCM22 constitutes a rectangular shape with a Y axis direction used as a longitudinal direction thereof and with an X axis direction used as a short side direction thereof, as seen from the direction of a normal to a plane (or the direction perpendicular to the drawing: a Z axis direction). Referring to FIG. 1, the CMOS circuit module regions CCM11 to CCM22 are aligned in two columns and six rows. In each of the CMOS circuit module regions CCM11 to CCM22, an N well or a P well (not shown) is formed within the region, and the CMOS circuit module regions CCM11 to CCM22 are electrically separated by field oxide films (not shown) at boundaries thereof. The longitudinal direction (Y axis direction) of each of the CMOS circuit module regions CCM11 to CCM22 is parallel to a scan direction (direction of scanning by a step-and-scan type projection exposure apparatus 2: Y axis direction). The longitudinal direction of a gate pattern associated with the circuit functional modules CFM11 to CFM22 formed on the CMOS circuit module regions CCM11 to CCM22, respectively, is the same as the scan direction of the step-and-scan type projection exposure apparatus 2. With regard to other respects, the configuration of the semiconductor integrated circuit device is the same as the configuration of a conventional semiconductor integrated circuit device shown in FIGS. 6 and 7. Thus, refer to a description in columns about [BACKGROUND OF THE INVENTION] described above. The entire disclosure in the BACKGROUND is herein incorporated by reference thereto.

In the semiconductor integrated circuit device manufacturing method according to the first embodiment, the step-and-scan type projection exposure apparatus 2 is used to expose the wafer substrate 25. A photoresist (not shown) for gate pattern formation is thereby formed (refer to FIG. 4). With respect to a configuration and an operation of the step-and-scan type projection exposure apparatus 2, refer to a description in columns about [Means for Solution to the Problems] described above and FIGS. 4 and 5.

In the core region 10 of the wafer substrate 25, the CMOS circuit module regions CCM11 to CCM22 that are subject to substrate bias control are formed. Then, a gate insulating film (not shown) is formed on the substrate, a gate electrode material film (not shown) is formed on the gate insulating film, and a photoresist film (not shown) is formed on the gate electrode material film. The wafer substrate 25 is mounted on a wafer stage 28 so that the longitudinal direction of the respective CMOS circuit module regions CCM11 to CCM22 is in the same direction as the scan direction of the step-and-scan type projection exposure apparatus 2.

A photomask 22 has a gate pattern (not shown) associated with the circuit functional modules (CFM11 to CFRM22 in FIG. 7), and the longitudinal direction of the gate pattern is arranged in the same direction as the scan direction of the step-and-scan type projection exposure apparatus.

When the wafer substrate 25 is exposed by the step-and-scan type projection exposure apparatus 2, scanning is performed in the longitudinal direction (Y axis direction) of the respective CMOS circuit module regions (CCM11 to CCM22 in FIG. 1) using the photomask 22 as a mask. Then, development is performed to cure (harden) the photoresist (not shown). Then, by selectively etching the gate electrode material film (and the gate insulating film) to be exposed, for removal, with the cured photoresist used as the mask, gate formation is performed. The photoresist is then removed. Thereafter, a semiconductor integrated circuit will be manufactured by a normal process.

According to the first embodiment, a variation component of variation in channel lengths of formed MOS transistors in the Y axis direction (scan direction) is reduced more than that in the X axis direction. Thus, compared with a conventional example, variation in the characteristics of the MOS transistors in the individual CMOS circuit module regions CCM11 to CCM22 is reduced. Accordingly, circuit performances (operating speeds) of the circuit functional modules CFM11 to CFM22 which are constituents of the CMOS circuit module regions CCM11 to CCM22 are improved.

SECOND EMBODIMENT

Figure 2:
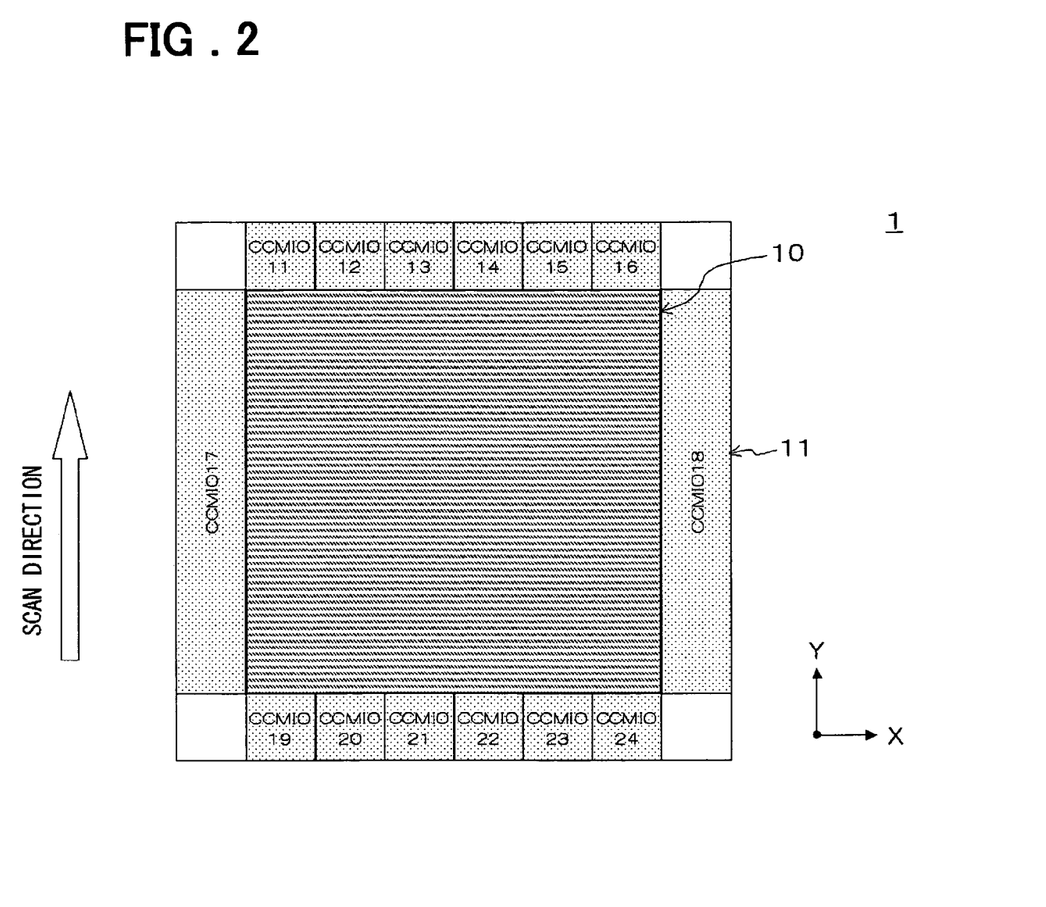
FIG. 2 is a plan view schematically showing a configuration of a semiconductor integrated circuit device manufactured by a semiconductor integrated circuit device manufacturing method according to a second embodiment of the present invention.
Figure 3:
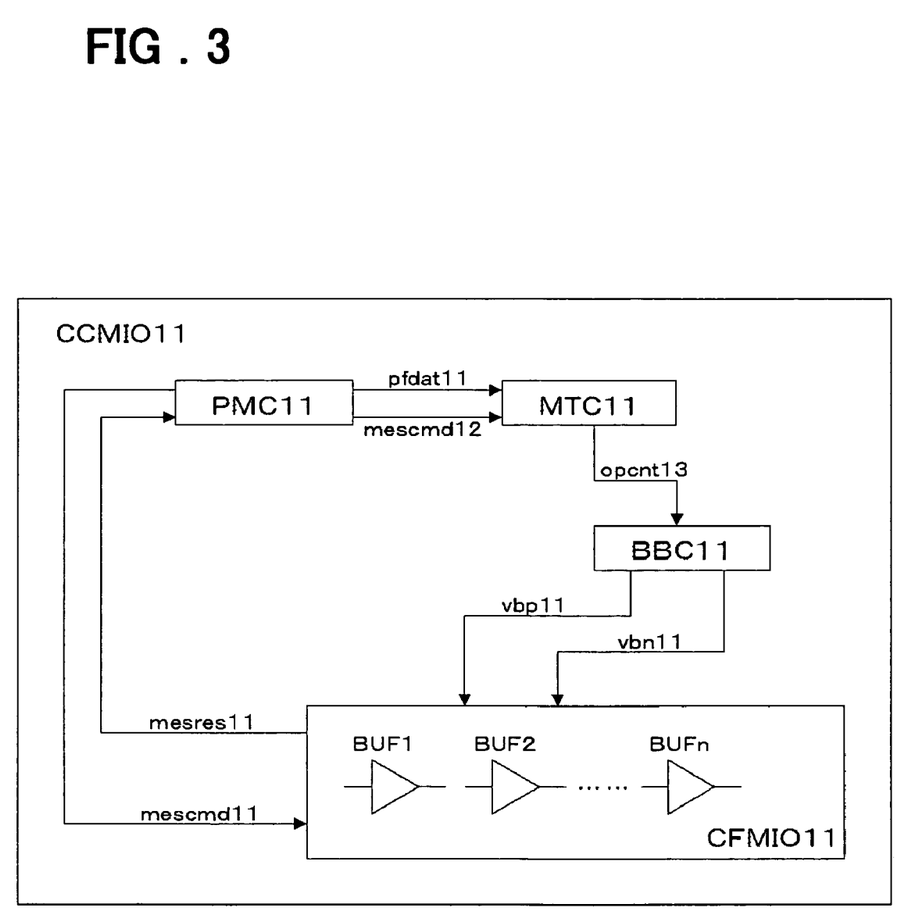
FIG. 3 is a block diagram schematically showing an example of a configuration of a CMOS circuit module region in the semiconductor integrated circuit device manufactured by the semiconductor integrated circuit device manufacturing method according to the second embodiment of the present invention.

Next, a semiconductor integrated circuit manufacturing method according to a second embodiment of the present invention will be described using drawings. FIG. 2 is a plan view schematically showing a configuration of a semiconductor integrated circuit device manufactured by the semiconductor integrated circuit device manufacturing method according to the second embodiment of the present invention. FIG. 3 is a block diagram schematically showing an example of a configuration of a CMOS circuit module region in the semiconductor integrated circuit device manufactured by the semiconductor integrated circuit device manufacturing method according to the second embodiment of the present invention.

The input/output region 11 of the semiconductor integrated circuit device 1 manufactured by the semiconductor integrated circuit device manufacturing method according to the second embodiment is the region having CMOS circuit module regions CCMIO11 to CCMIO24 (refer to FIG. 2). The CMOS circuit module regions CCMIO11 to CCMIO16 and the CMOS circuit module regions CCMIO19 to CCMIO24 are obtained by division into a plurality of regions in the input/output region 11 arranged at both ends of the core region 10 in the Y axis direction, as seen from the direction of the normal to the plane (or the direction perpendicular to the drawing: Z axis direction). Referring to FIG. 2, each of the CMOS circuit module regions CCMIO11 to CCMIO16 and the CMOS circuit module regions CCMIO19 to CCMIO24 is aligned in one row and six columns. The CMOS circuit module region CCMIO17 and CCMIO18 are arranged at both ends of the core region 10 in the X axis direction. In each of the CMOS circuit module regions CCMIO11 to CCMIO24, an N well or a P well (not shown) is formed within each of the regions, and the CMOS circuit module regions CCMIO11 to CCMIO24 are electrically separated by the field oxide films (not shown) at the boundaries thereof. The direction of the boundaries (Y axis direction) of the CMOS circuit module regions CCMIO11 to CCMIO16, CCMIO19 to CCMIO24, each of which are adjacent to one another, is parallel to the scan direction (direction of scanning by the step-and-scan type projection exposure apparatus: Y axis direction). The core region 10 is the same as the core region (indicated by reference numeral 10 in FIG. 1) in the first embodiment. Other respects are same as those in the configuration of the conventional semiconductor integrated circuit device shown in FIGS. 6 and 7. Thus, refer to the description in the columns about "BACKGROUND" described above.

In the CMOS circuit module region CCMIO11, a circuit functional module CFMIO11, a performance measurement circuit PMC11, a storage table circuit MTC11, and a substrate bias control circuit BBC11 are formed (refer to FIG. 3). With regard to the CMOS circuit module regions CCMIO12 to CCMIO24 as well, the CMOS circuit module regions CCMIO12 to CCMIO24 are formed in the same way as the CMOS circuit module region CCMIO11.

The circuit functional module CFMIO11 is constituted from one or a plurality of I/O buffers BUF1 to BUFn. To the circuit functional module CFMIO11, a PMOS transistor substrate bias vbp11, an NMOS transistor substrate bias vbn11, and a measurement command signal mescmd11 are input. The circuit functional module CFMIO11 outputs a measurement result signal mesres11. The performance measurement circuit PMC11 outputs the measurement command signal mescmd11 and a measurement command signal mescmd12. The measurement result signal mesres11 is input to the performance measurement circuit PMC11, and the performance measurement circuit PMC11 outputs a result associated with the measurement result signal mesres11 as a performance data signal pfdat11. The measurement command signal mescmd12 and the performance data signal pfdat11 are input to the storage (memory) table circuit MTC11. The storage table circuit MTC11 outputs an operation control signal opcnt13. The operation control signal opcnt13 is input to the substrate bias control circuit BBC11. The substrate bias control circuit BBC11 outputs the PMOS transistor substrate bias vbp11 and the NMOS transistor substrate bias vbn11.

Performance such as an operation speed or power consumption of the circuit functional module CFMIO11 changes according to voltages of the substrate biases vbp11 and vbn11 supplied to the circuit functional module CFMIO11. In order to maximize a ratio of the operation speed of the circuit functional module CFMIO11 to the power consumption of the circuit functional module CFMIO11 and to implement optimal control over the substrate biases vbp11 and vbn11, performance measurement is performed on all combinations of the voltages of the substrate biases vbp11 and vbn11 that can be generated by the substrate bias control circuit BBC11, and an optimal condition is then determined.

In the semiconductor integrated circuit device manufacturing method according to the second embodiment, the step-and-scan type projection exposure apparatus 2 is employed to expose the wafer substrate 25, thereby forming a photoresist (not shown) for gate pattern formation (refer to FIG. 4). With respect to the configuration of the step-and-scan type projection exposure apparatus 2, refer to the description in the columns about "solution to the problems" described above.

In the input/output region 11 of the wafer substrate 25, the CMOS circuit module regions CCMIO11 to CCMIO24 that are subject to the substrate bias control are formed. Then, the gate insulating film (not shown) is formed on the substrate, the gate electrode material film (not shown) is formed on the gate insulating film, and the photoresist film (not shown) is formed on the gate electrode material film. The wafer substrate 25 is mounted on the wafer stage 28 so that the direction of boundaries between the CMOS circuit module regions CCMIO11 to CCMIO16, between the CCMIO19 to CCMIO24 is in the same direction as the scan direction of the step-and-scan type projection exposure apparatus 2.

The photomask 22 has a gate pattern (not shown) associated with the circuit functional modules (CFMIO11 to CFRMIO22 in FIG. 3), and the longitudinal direction of the gate pattern is arranged in the same direction as the scan direction of the step-and-scan type projection exposure apparatus.

When the wafer substrate 25 is exposed by the step-and-scan type projection exposure apparatus 22, scanning is performed in the direction (Y axis direction) of the boundaries between the CMOS circuit module regions CCMIO11 to CCMIO16, CCMIO19 to CCMIO24 using the photomask 22 as the mask. Then, development is performed to cure (harden) the photoresist (not shown). Then, by selectively etching the gate electrode material film (and the gate insulating film) to be exposed, for removal, gate formation is performed. The photoresist is then removed. Thereafter, the semiconductor integrated circuit will be manufactured by a normal process.

According to the second embodiment, a variation component of variation in the channel lengths of the formed MOS transistors in the Y axis direction is reduced more than that in the X axis direction. Thus, variation in the characteristics of the MOS transistors in the individual CMOS circuit module regions CCMIO11 to CCMIO24 is reduced. Accordingly, circuit performances (operating speeds) of the circuit functional modules CFMIO11 to CFMIO24 which are constituents of the CMOS circuit module regions CCMIO11 to CCMIO24 are improved. Further, by executing only the substrate bias control over the circuit functional modules CFMIO11 to CFMIO24, variation in delays of the I/O buffers on the surface of a chip can be reduced.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device manufacturing method comprising the steps of:
   (a) providing a wafer substrate including a semiconductor integrated circuit device having a plurality of CMOS circuit module regions formed in a core region thereof, said CMOS circuit module regions being subject to substrate bias control, said semiconductor integrated circuit device being configured to include a gate insulating film formed on said substrate, a gate electrode material film formed on said gate insulating film, and a photoresist film formed on said gate electrode material film; and
   (b) exposing said wafer substrate using a step-and-scan type projection exposure apparatus;
   wherein upon said exposing, scanning is performed in a same direction as a longitudinal direction of each of said CMOS circuit module regions in said core region.

2. The semiconductor integrated circuit device according to claim 1, wherein a gate pattern associated with circuit functional modules of said CMOS circuit module regions in said core region is formed in a photomask used at a time of the exposure by said step-and-scan type projection exposure apparatus, and a longitudinal direction of said gate pattern is arranged in a same direction as a scan direction of said step-and-scan type projection exposure apparatus.

3. A semiconductor integrated circuit device manufacturing method comprising the steps of:
   (a) providing a wafer substrate including a semiconductor integrated circuit device having a plurality of CMOS circuit module regions formed in an input/output region thereof, said CMOS circuit module regions being subject to substrate bias control, said semiconductor integrated circuit device being configured to include a gate insulating film formed on said substrate, a gate electrode material film formed on said gate insulating film, and a photoresist film formed on said gate electrode material film; and
   (b) exposing said wafer substrate using a step-and-scan type projection exposure apparatus,
   wherein upon said exposing, scanning is performed in a same direction as a direction of boundaries between said CMOS circuit module regions being adjacent to one another in said input/output region.

4. The semiconductor integrated circuit device manufacturing method according to claim 3, wherein a gate pattern associated with circuit functional modules of said CMOS circuit module regions in said input/output region is formed in a photomask used at a time of the exposure by said step-and-scan type projection exposure apparatus, and a longitudinal direction of said gate pattern is arranged in a same direction as a scan direction of said step-and-scan type projection exposure apparatus.

* * * * *